(12) United States Patent
Martin

(10) Patent No.: US 7,369,905 B1
(45) Date of Patent: May 6, 2008

(54) METHOD AND APPARATUS FOR PRESSURE AND PLASMA CONTROL DURING TRANSITIONS USED TO CREATE GRADED INTERFACES BY MULTI-STEP PECVD DEPOSITION

(75) Inventor: Jeremy Isaac Martin, Annandale on Hudson, NY (US)

(73) Assignee: Advanced Micro Devices, Austin, TX (US)

( * ) Notice: Subject to any disclaimer, the term of this patent is extended or adjusted under 35 U.S.C. 154(b) by 277 days.

(21) Appl. No.: 11/044,591

(22) Filed: Jan. 28, 2005

(51) Int. Cl.
*G05B 13/00* (2006.01)
*G06F 19/00* (2006.01)
(52) U.S. Cl. .................................. 700/31; 700/121
(58) Field of Classification Search ............ 700/28–31, 700/71, 108–110, 117–121, 123, 129
See application file for complete search history.

(56) References Cited

U.S. PATENT DOCUMENTS

| | | | | |
|---|---|---|---|---|
| 5,408,405 A | * | 4/1995 | Mozumder et al. ............ | 700/31 |
| 5,740,033 A | * | 4/1998 | Wassick et al. ................ | 700/29 |
| 6,056,781 A | * | 5/2000 | Wassick et al. ................ | 703/12 |
| 6,512,991 B1 | * | 1/2003 | Davis et al. ................ | 702/136 |
| 6,913,938 B2 | * | 7/2005 | Shanmugasundram et al. ........................... | 438/16 |
| 6,943,053 B2 | * | 9/2005 | Oluseyi ....................... | 438/70 |
| 7,082,345 B2 | * | 7/2006 | Shanmugasundram et al. ........................... | 700/121 |
| 7,155,301 B2 | * | 12/2006 | Li et al. ...................... | 700/121 |
| 2002/0199082 A1 | * | 12/2002 | Shanmugasundram et al. ........................... | 712/208 |
| 2003/0049390 A1 | * | 3/2003 | Shanmugasundram et al. ........................... | 427/585 |
| 2003/0190761 A1 | * | 10/2003 | Oluseyi ......................... | 438/7 |
| 2005/0026434 A1 | * | 2/2005 | Huy et al. ................... | 438/689 |
| 2005/0289487 A1 | * | 12/2005 | Li et al. ........................ | 716/4 |
| 2006/0064188 A1 | * | 3/2006 | Ushiku et al. ................ | 700/96 |

* cited by examiner

*Primary Examiner*—M. N. Von Buhr
(74) *Attorney, Agent, or Firm*—McDermott Will Emery

(57) ABSTRACT

A method and apparatus are provided for a graded PECVD process that continuously modulates a set of flow and pressure conditions while the plasma power is turned on and a film is being deposited. A feedback mechanism specific to a give deposition recipe is used to generate, optimize and maintain a dynamic profile for a first input process parameter that produces a desired dynamic profile for a first output process parameter. An iterative approach produces a gradually converging series of dynamic profiles of an input profile parameter, which eventually succeeds in producing the desired dynamic profile for the first output process parameter of the graded PECVD process.

18 Claims, 2 Drawing Sheets

METHOD AND APPARATUS FOR PRESSURE AND PLASMA CONTROL DURING TRANSITIONS USED TO CREATE GRADED INTERFACES BY MULTI-STEP PECVD DEPOSITION

FIELD OF THE INVENTION

The present invention relates to the field of chemical vapor deposition, and more particularly, to a graded plasma enhanced chemical vapor deposition (PECVD) process.

BACKGROUND OF THE INVENTION

One of the primary steps in the fabrication of modern semiconductor devices is the formation of metal and dielectric films on a substrate by chemical reaction of gases. Such deposition processes are referred to as chemical vapor deposition or CVD. Conventional thermal CVD processes supply reactive gases to the substrate surface for heat-induced chemical reactions to take place to produce a desired film. The high temperatures at which some thermal CVD processes operate can damage device structures having layers previously formed on the substrate. A preferred method of depositing metal and dielectric films at relatively low temperatures is plasma-enhanced CVD (PECVD) techniques. The PECVD techniques promote excitation and/or disassociation of the reactant gases by the application of radio frequency (RF) energy to a reaction zone near the substrate surface, thereby creating a plasma of highly reactive species. The reactivity of the released species reduces the energy required for a chemical reaction to take place, and thus lowers the required temperature for such a PECVD process.

Graded PECVD processes are used to enhance adhesion or other interfacial properties that improve electromagnetic performance and other device qualities. The graded PECVD processes require changing of gas or liquid flows and/or pressures during a deposition process. The standard practice is to optimize the control of each individual parameter, such as the throttle valve setting, to achieve a fixed output, such as pressure. However, if employing a servo pressure control, for example, there is an unstable period as the pressure is brought under control this leads unpredictable and sub-optimal interfacial properties in the graded interface or thin layer. One way of addressing this is to eliminate the servo control and use fixed throttle valve settings during transition steps. Such a fixed position may be chosen by examining what setting produces a stable pressure during a steady state running of the next flow regime. However, this setting may change over time, so that the fixed setting may not be appropriate in future situations. Furthermore, this technique using a fixed throttle valve setting does not allow for any correction to the throttle valve to handle flow or plasma power instabilities that may occur as gas flows change from one setting to the next. Another method employs specifying a linear ramp rate when changing parameters such as power levels. This approach does not account for dynamic conditions and relies upon the correctness of the linear relationship and assumes the conditions do not change.

A graded interface is therefore difficult to attain in PECVD tools operating in their normal mode because the pressure control through the throttle valve and the flow control through the mass flow controller and the power control through the matching network do not perform well under dynamic conditions. Hence, it is generally necessary to stabilize flows and pressure prior to turning on the power and initiating deposition. Once a deposition is started, there is also a certain time before the matching network stabilizes the plasma power. Thus, only a discrete series of layers is attainable. In order to achieve the most repeatable stable film properties, each deposition step is much longer than the time required for the matching network to stabilize the plasma power.

SUMMARY OF THE INVENTION

There is a need for a method and apparatus for forming a graded layer and interface using a PECVD process, in a manner that attains more stable interfacial properties in the graded layer and generally provides better control depositions, especially at the initiation phase.

This and other needs are met by embodiments of the present invention which provide a method of controlling a graded plasma enhanced chemical vapor deposition (PECVD) process. This method comprises the steps of determining a desired dynamic profile for a first output process parameter of a graded PECVD process. A dynamic profile is determined for a first input process parameter that produces the desired dynamic profile for the first output process parameter during the graded PECVD process.

The creation of a dynamic profile for a first input process parameter to produce a desired dynamic profile for a first output process parameter allows for the continuous modulation of the input and output conditions, while the plasma power is turned on and the film is being deposited. This is in contrast to conventional PECVD methodologies in which fixed settings are employed during transition steps, rather than using a dynamic profile.

The earlier stated needs are also met by other embodiments of the present invention which provide a PECVD apparatus that includes a PECVD processing chamber, and a controller that determines a desired dynamic profile for a first output process parameter of a graded PECVD process, and determines the dynamic profile for a first input process parameter that produces the desired dynamic profile for the first output process parameter during the graded PECVD process.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the formation of graded layers by the PECVD process. In particular, the present invention addresses the problems regarding process instability during the changing of the gas or liquid flows and/or pressures during the PECVD process. Such instabilities lead to unpredictable and sub-optimal interfacial properties. Instead of using servo control or fixed throttle valve settings during transition steps, which settings may change over time and do not allow for any correction to the throttle valve to handle flow or plasma power instabilities, the present invention provides for a continuous modulation of the set flow and pressure conditions while the plasma power is turned on and the film is being deposited. This leads to an improvement in the properties in the graded interfaces with respect to adhesion and other physical and electrical properties.

Figure 1:
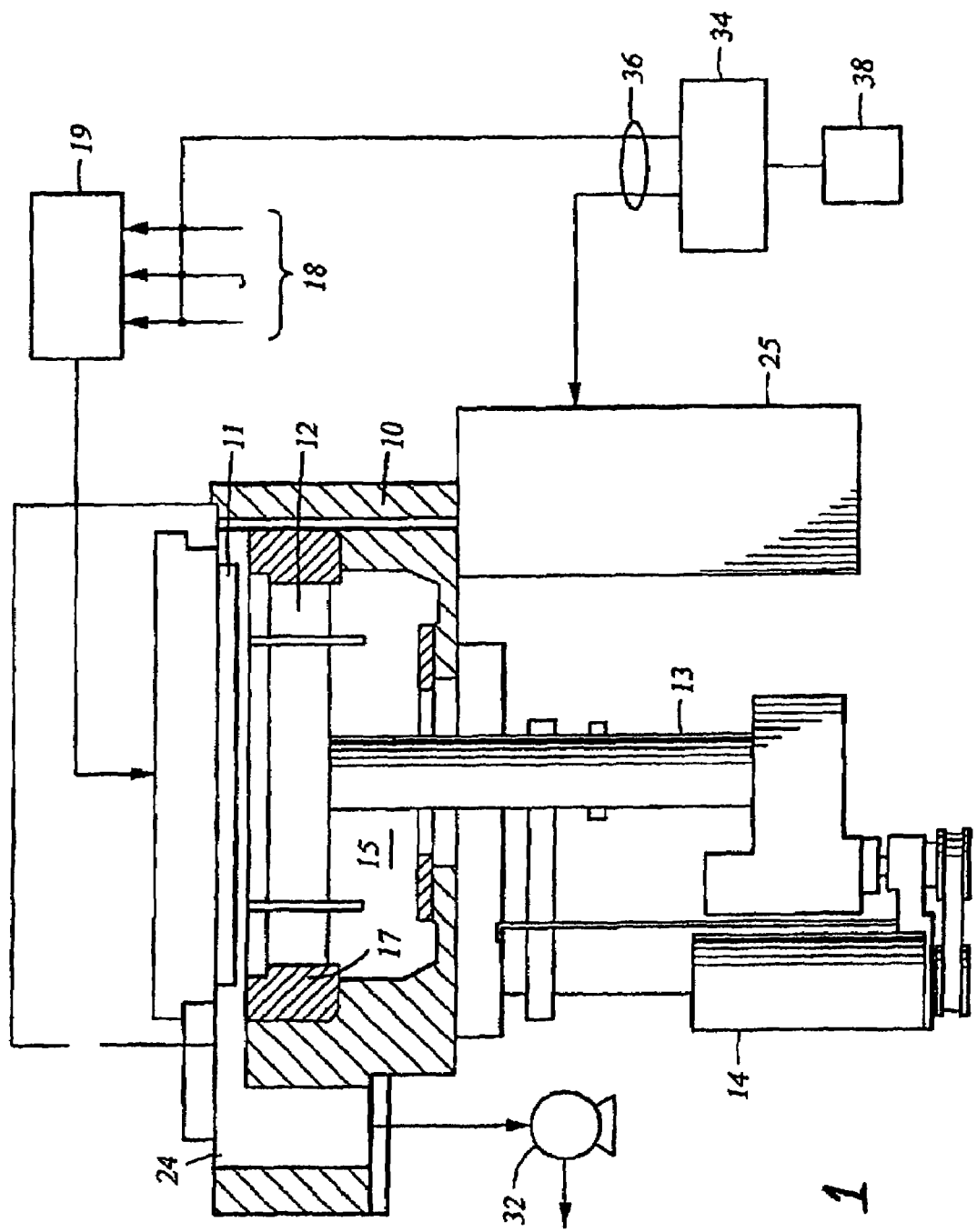
FIG. 1 is a cross-sectional depiction of an exemplary PECVD apparatus configured for use in accordance with embodiments of the present invention.

FIG. 1 is a cross-sectional depiction of an exemplary PECVD processing apparatus that is configured to perform the method of the present invention. The physical configuration of the PECVD apparatus is exemplary only, as other physical configurations may be employed without departing from the scope of the present invention. The apparatus of the invention provides for a control of the apparatus to continuously modulate the set of flow and pressure conditions during the PECVD process to provide an improved graded layer.

A suitable PECVD plasma reactor for performing the method of the present invention has a parallel plate chemical vapor deposition reactor 10 with a high vacuum region 15. The reactor 10 contains a gas distribution manifold 11 for dispersing process gases through perforated holes in the manifold to a substrate or wafer (not shown) that rests on a substrate support plate or susceptor 12 which is raised and lowered by lift motor 14. The reactor 10 includes heating of the process gases and substrate, such as resistive heating coils (not shown) or external lamps (not shown). The susceptor 12 is mounted on a support stem 13 so that the susceptor 12 and the wafer supported on the upper surface of susceptor 12, can be controllably moved between the lower loading/off-loading position and an upper processing position which is closely adjacent to manifold 11.

When susceptor 12 and the wafer are in processing position 14, they are surrounded by an insulator 17, and process gases exhaust into a manifold 24. During processing, gases inlet to manifold 11 are uniformly distributed radially across the surface of the wafer. A vacuum pump 32 includes a throttle valve that controls the exhaust rate of gases from the chamber.

Prior to reaching manifold 11, deposition and carrier gases are input through gas lines 18 into a mixing system 19 where they are combined and provided to the manifold 11. Generally, the process gases supply line 18 for each of the process gases also includes safety shut off valves that can be used to automatically or manual shut off the flow of process gases into the chamber, and mass flow controllers that measure the flow of gas through the gas supply lines.

In a plasma process, a controlled plasma is typically formed adjacent to the wafer by RF energy supply to distribution manifold 11 from RF power supply 25, with susceptor 12 grounded. Alternatively, RF power can be provided to the susceptor 12 or RF power can be provided to different components at different frequencies. RF power supply 25 can supply either single or mixed frequency RF power to enhance the decomposition of reactive species introduced into the high vacuum region 15. Mixed frequency RF power supply typically supplies power at a high RF frequency (RF1) of 13.56 MHz to the distribution manifold 11 and at a low RF frequency (RF2) of 360 KHz to the susceptor 12.

The lift motor 14 raises and lowers between a processing position and a lower, wafer-loading position. The motor 14, gas mixing system 19, and the RF power 25 are controlled by a system controller 34 over control lines 36. A reactor also includes analog assemblies, such as mass flow controllers (MFCs) and standard or pulsed RF generators that are controlled by the system controller 34 which executes system control software stored in a memory 38, which is a hard disk drive in the illustrated embodiment. Motors and optical sensors may be used to move and determine the position of movable mechanical assemblies such as the throttle valve of the vacuum pump 32. System controller 34 controls all of the activities of the PECVD reactor.

As described earlier, a graded PECVD process requires the changing of gas or liquid flows and/or pressures during the deposition process. With servo pressure control, such as used in prior art devices, there is an unstable period as the pressure is brought under control. This leads to unpredictable and sub-optimal interfacial properties. In other arrangements, in which the servo controllers are eliminated, fixed throttle valve settings are employed during transition steps. The fixed setting is typically chosen by determining what setting produces a stable pressure during a steady state running of an upcoming flow regime. However, such a system does not provide for a dynamic response to flow or plasma power instabilities that may occur as the gas flows are changing from one setting to the next. The present invention provides for advanced process control methodologies to control the pressure, flow controllers and power during transitions to create more stable interfacial properties and more manufacturable processes.

In the present invention, the set of flow and pressure conditions modulate continuously while the plasma power is turned on and the film is being deposited. In the following example, the control of pressure as a process parameter is described. However, the same control techniques may be applied to gas and liquid flow control through the mass controllers and plasma power control through the matching network. In the example, the pressure is normally controlled by a PID or other controller that makes adjustments to the throttle valve setting (input "T") in order to achieve desired pressures, such as measured by a baratron attached to the chamber (output "P"). The controller 34 uses variables that control the algorithm used to govern T in order to achieve P, and these are system constants, which are constant throughout a process, and most likely constant for all processes run on a given tool. The present invention provides a feedback mechanism for the controller 34 that is specific to a given deposition recipe to generate, optimize and maintain a dynamic profile for an input process parameter that produces a desired dynamic profile for the output parameter. In the following example the input process parameter is temperature (T) and the output process parameter is pressure (P).

The process that generates a dynamic profile for an input process parameter to achieve a desired output profile for an output process parameter is as follows. When a new process recipe is defined, an initial set of practice runs is used to generate a input profile T. The initial run is a simple estimation of the profile for T. Such a simple estimation may be obtained, for example by assuming a linear relationship between the input process parameter (T) and the output process parameter (P). A trial run is then conducted, and the actual output process P is compared with the desired output profile P. Based upon these comparisons, an adjustment is made to the input profile T. The adjustment is made iteratively, employing well known methods in the field of control and dynamical systems. Hence, following the initial run and adjustment of the dynamic profile for the first input process parameter T, additional production runs are made and adjustments made to the input profile T based upon the comparison of the actual output profile P with a desired output profile P. This results in a gradually converging series of input profiles T, which eventually succeed in producing the desired output profile P, without any significant overshoot or undershoot in the output process parameter P.

Figure 2:
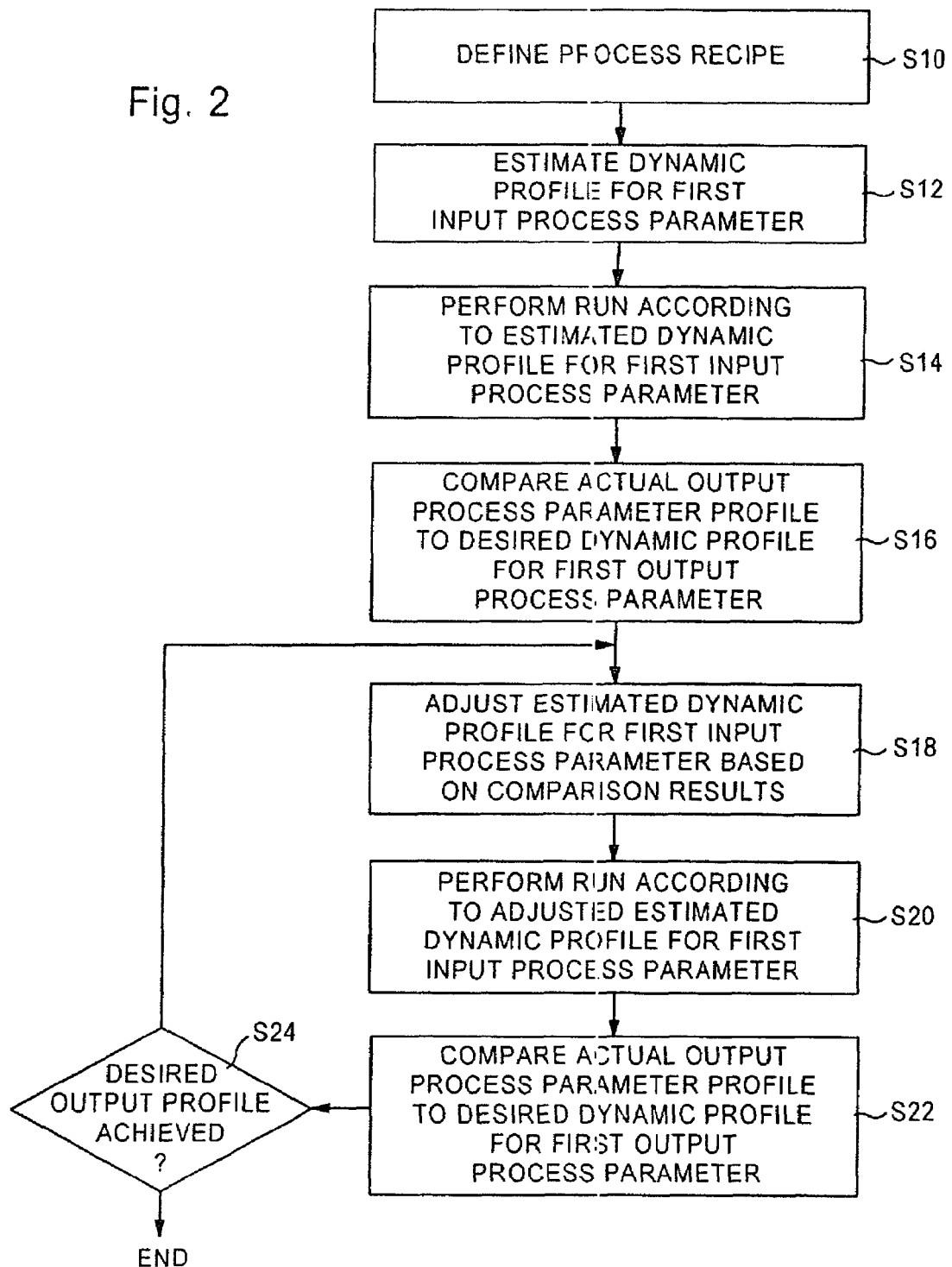
FIG. 2 is a simplified flow chart depicting certain steps conducted in accordance with exemplary embodiments of the method of the present invention.

The above-described process is depicted in FIG. 2. In step S10, a new process recipe is defined. The controller 34 provides an initial estimation of a dynamic profile for the first input process parameter, e.g., T, in step S12. Following this estimation, in step S14 a first run is performed according to the first estimated dynamic profile for the first input process parameter. Controller 34 controls the process apparatus depicted in FIG. 1 to perform the production run according to the first estimated dynamic profile for the first output process parameter. Also in this step, during the production run, the actual output process parameter profile is measured by conventional pressure measuring techniques, such as the use of the baratron.

In step S16, the controller 34 compares the actual output profile measured in step S14 the desired dynamic profile for the first output process parameter. Based on this comparison, in step S18 the controller 34 adjusts the estimated dynamic profile for the first input process parameter to converge on the desired output profile for the first output process parameter. In step S20, another run is then made, and the apparatus controlled by the controller 34 in accordance with the adjusted dynamic profile for the first input process parameter. As in step S14, the actual first output process parameter during this run is measured. A comparison of the actual measured first output process parameter is then made against the desired dynamic profile for the first output process parameter, in step S22. If the comparison between the first output process parameter as measured produces the desired output profile, without any significant overshoot or undershoot, as determined in step S24, then a dynamic profile for a first input process parameter has been determined that produces the desired dynamic profile for the first output process parameter during the graded PECVD process. If the comparison does not show this match, the process loops back to step S18 in which the dynamic profile for the input process parameter is adjusted. The process continues to perform production runs and adjustments of the dynamic profile for the first input process parameter until the desired dynamic profile for the first output process parameter for the graded PECVD process is achieved.

Once the initial dynamic profile for the first input process parameter is determined, this profile can be optimized every time the process is exercised, so that it can be continuously corrected for any changes that may result from drift in the tool. Changes may also be monitored according to the standard procedures of statistical process control, to ensure that any undesirable changes to the operation of the tool or process can be reported as soon as possible to provide a warning that there may be a malfunction.

The methodology described above can be applied to the control of mass flow controllers and matching networks and other tool controls, in order to achieve a process which can dynamically vary all of the process parameters without requiring stabilization steps, allowing for better control of depositions, especially at the initiating phase, and allowing the creation of graded interfaces. In certain embodiments, control of each of these parameters is performed independently for each recipe. However, in certain other embodiments, entire recipes are handled to provide a multi-input/multi-output parameter profile optimization. In such embodiments, a desired dynamic profile for multiple output process parameters of the graded PECVD process is formed. A dynamic profile for multiple input process parameters is then determined that produces the desired dynamic profile for multiple output process parameters during the graded PECVD process. Production runs are performed in accordance with the desired dynamic profile for the multiple output process parameters.

The present invention eliminates the stabilization periods during which pressures are not well-controlled, and instead uses an iterative optimization of the input profile to achieve a desired output profile. Since the optimization acts to optimize the whole profile rather than merely achieve a fixed output at each moment, more controllable results are obtainable, especially as the process transitions from one desired output level to another. This finds utility in producing continuously graded interfaces, although in general, more uniform interfacial properties are also produced by the methodology and apparatus of the present invention.

Although the present invention has been described and illustrated in detail, it is to be clearly understood that the same is by way of illustration and example only, and is not to be taken by way of limitation, the scope of the present invention being limited only by the terms of the appended claims.

What is claimed is:

1. A method of controlling a graded plasma enhanced chemical vapor deposition (PECVD) process, comprising the steps:

determining a desired dynamic profile for a first output process parameter of a graded PECVD process; and determining a dynamic profile for a first input process parameter that produces the desired dynamic profile for the first output process parameter during the graded PECVD process wherein the step of determining a dynamic profile for a first input process parameter includes iteratively optimizing an initial dynamic profile for a first input process parameter to converge on the desired dynamic profile for the first output process parameter;

wherein the step of iteratively optimizing includes: forming the initial dynamic profile for a first input process parameter; performing a first production run in accordance with the initial dynamic profile for a first input process parameter; measuring an actual dynamic profile for the first output process parameter; comparing the actual dynamic profile for the first output process parameter with the desired dynamic profile for the first output process parameter; and adjusting the initial dynamic profile for a first input process parameter based on the results of the comparing to generate an adjusted dynamic profile for the first input process parameter.

2. The method of claim 1, wherein the step of iteratively optimizing further includes iteratively performing the steps of:

performing a production run in accordance with the adjusted dynamic profile for the first input process parameter; measuring the actual dynamic profile for the first output process parameter; comparing the actual dynamic profile for the first output process parameter with the desired dynamic profile for the first output process parameter; and generating a new adjusted dynamic profile for the first input process parameter based on the results of the comparing in each iteration.

3. The method of claim 2, wherein the step of iteratively optimizing further includes generating the determined dynamic profile for the first input process parameter when the step of iteratively performing produces an actual dynamic profile for the first output process parameter that is within a predetermined similarity of the desired dynamic profile of the first output process parameter.

4. The method of claim 3, further comprising performing production runs of the graded PECVD process in accordance with the determined dynamic profile for the first input process parameter.

5. The method of claim 4, further comprising further adjusting the determined dynamic profile for the first input process parameter after production runs of the graded PECVD process, to continue to bring the actual dynamic profile for the first output process parameter towards the desired dynamic profile.

6. The method of claim 5, wherein the PECVD process is performed in a PECVD tool, and the first output process parameter is pressure, and the first input process parameter is temperature.

7. The method of claim 5, wherein the PECVD process is performed in a PECVD tool having parameter control inputs for controlling input process parameters, the steps of performing production runs including adjusting the parameter control inputs of the PECVD tool in a continuous manner to thereby control the input process parameters.

8. The method of claim 7, further comprising forming a desired dynamic profile for multiple output process parameters of a graded PECVD process; determining a dynamic profile for multiple input process parameters that produces the desired dynamic profile for the multiple output process parameters during the graded PECVD process; and performing production runs in accordance with the desired dynamic profile for the multiple output process parameters.

9. A graded plasma enhanced chemical vapor deposition (PECVD) apparatus, comprising:
a PECVD reactor; and
a controller coupled to the reactor to control a plurality of input process parameters, the controller including means for determining a desired dynamic profile for a first output process parameter of a graded PECVD process, and means for determining a dynamic profile for a first input process parameter that produces the desired dynamic profile for the first output process parameter during the graded PECVD process.

10. The apparatus of claim 9, wherein the means for determining a dynamic profile for a first input process parameter includes means for iteratively optimizing an initial dynamic profile for a first input process parameter to converge on the desired dynamic profile for the first output process parameter.

11. The apparatus of claim 10, wherein the means for iteratively optimizing includes: means for forming the initial dynamic profile for a first input process parameter; means for performing a first production run in accordance with the initial dynamic profile for a first input process parameter; means for measuring an actual dynamic profile for the first output process parameter; means for comparing the actual dynamic profile for the first output process parameter with the desired dynamic profile for the first output process parameter; and means for adjusting the initial dynamic profile for a first input process parameter based on the results of the comparing to generate an adjusted dynamic profile for the first input process parameter.

12. The apparatus of claim 11, wherein the means for iteratively optimizing further includes means for iteratively:
performing a production run in accordance with the adjusted dynamic profile for the first input process parameter; measuring the actual dynamic profile for the first output process parameter; comparing the actual dynamic profile for the first output process parameter with the desired dynamic profile for the first output process parameter; and generating a new adjusted dynamic profile for the first input process parameter based on the results of the comparing in each iteration.

13. The apparatus of claim 12, wherein the means for iteratively optimizing further includes means for generating the determined dynamic profile for the first input process parameter when the means for iteratively performing produces an actual dynamic profile for the first output process parameter that is within a predetermined similarity of the desired dynamic profile of the first output process parameter.

14. The apparatus of claim 13, wherein the controller is configured to cause the reactor to perform production runs of the graded PECVD process in accordance with the determined dynamic profile for the first input process parameter.

15. The apparatus of claim 14, wherein the controller further includes means for adjusting the determined dynamic profile for the first input process parameter after production runs of the graded PECVD process, to continue to bring the actual dynamic profile for the first output process parameter towards the desired dynamic profile.

16. The apparatus of claim 15, wherein the first output process parameter is pressure, and the first input process parameter is temperature.

17. The apparatus of claim 15, wherein the PECVD reactor has parameter control inputs for controlling input process parameters, the controller including means for adjusting the parameter control inputs of the PECVD reactor in a continuous manner to thereby control the input process parameters.

18. The apparatus of claim 17, wherein the controller includes means for forming a desired dynamic profile for multiple output process parameters of a graded PECVD process; means for determining a dynamic profile for multiple input process parameters that produces the desired dynamic profile for the multiple output process parameters during the graded PECVD process; and means for performing production runs in accordance with the desired dynamic profile for the multiple output process parameters.

* * * * *